(12) United States Patent
Nishimura et al.

(10) Patent No.: US 6,344,761 B2
(45) Date of Patent: Feb. 5, 2002

(54) CURRENT COMPARISON TYPE LATCH

(75) Inventors: Kazuko Nishimura, Kyoto; Hiroshi Kimura, Hyogo, both of (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 09/819,646

(22) Filed: Mar. 29, 2001

(30) Foreign Application Priority Data

Mar. 29, 2000 (JP) ........................................ 2000-090343

(51) Int. Cl.[7] ................................................ G11C 7/06
(52) U.S. Cl. ........................................... 327/55; 327/57
(58) Field of Search .............................. 327/51–57, 63, 327/65, 66, 210–212; 365/185.21, 189.07, 207

(56) References Cited

U.S. PATENT DOCUMENTS

| 5,132,576 A | * | 7/1992 | Park | 327/51 |
| 5,963,061 A | * | 10/1999 | Briner | 327/55 |
| 6,157,219 A | * | 12/2000 | Okada | 327/55 |
| 6,184,722 B1 | * | 2/2001 | Hayakawa | 327/57 |
| 6,265,907 B1 | * | 7/2001 | Sukegawa | 327/55 |

OTHER PUBLICATIONS

"A 100 Mhz 8 Bit CMOS Interpolating A/D Converter", by Steyaert et al., IEEE Custom Integrated Circuits Conference (1993), pp. 28.1.1–28.1.4.

* cited by examiner

Primary Examiner—Toan Tran
(74) Attorney, Agent, or Firm—McDermott, Will & Emery

(57) ABSTRACT

In a current comparison type latch, during a reset mode of the current comparison type latch where the clock signal is at the "L" level, transistors which are disposed along the current path extending from the high potential power supply line to the low potential power supply line are turned OFF while transistors which connect the high potential power supply line to two output terminals are turned ON, so as to bring the potential of each of the two output terminals to a logic level (the "H" level or the "L" level), thereby preventing a through current from flowing from the high potential power supply line to the low potential power supply line. Therefore, a high-speed and high-precision current comparison is made while reducing the through current during a reset mode.

8 Claims, 9 Drawing Sheets

CURRENT COMPARISON TYPE LATCH

BACKGROUND OF THE INVENTION

The present invention relates to a current comparison type latch for use in an analog-digital converter, and the like.

In the prior art, a voltage comparison type latch has been the mainstream latch for use in an analog-digital converter, and the like. However, as the recent trend toward reducing the voltage of an LSI, signal processing operations are now often performed by using a current, and there is an increasing demand for a current comparison type latch.

A conventional current comparison type latch is disclosed in an article "A 100 MHz 8 BIT CMOS INTERPOLATING A/D CONVERTER, M. Steyaert, R. Roovers and J. Craninckx" (IEEE 1993 CUSTOM INTEGRATED CIRCUITS CONFERENCE 28.1.1–28.1.4). As illustrated in FIG. 9, the current comparison type latch includes: input terminals IN1 and IN2 to which two signals to be compared are input, respectively; two output terminals OUT and OUTB; n-type transistors Q1 and Q2 whose gates are connected to a high potential side power supply VDD; an n-type transistor Q3 and a p-type transistor Q5 forming a first inverter, and an n-type transistor Q4 and a p-type transistor Q6 forming a second inverter, wherein the output of the first inverter is connected to the input of the second inverter and the output of the second inverter is connected to the input of the first inverter; and an n-type transistor Q7 provided between the input terminals of the two inverters for switching between a latch operation and a reset operation. In the current comparison type latch, the n-type transistor Q7 is turned ON, thereby performing a reset operation, when a control signal STB applied to the gate of the n-type transistor Q7 is at an "H" level, whereas the n-type transistor Q7 is turned OFF, thereby performing a latch operation, when the control signal STB is at an "L" level.

However, with the conventional current comparison type latch configuration, during a reset phase, the transistor Q7 is turned ON, whereby the gate potentials of the four transistors Q3 to Q6 forming the two inverters and the potentials of the two output terminals OUT and OUTB are all at the same potential. Therefore, the output potentials of the output terminals OUT and OUTB are not fixed at a logic level (the "H" level (the potential of the high potential side power supply VDD) or the "L" level (the potential of the low potential side power supply VSS)), but is fixed to a predetermined intermediate potential between these potentials. As a result, a through current flows from the high potential side power supply VDD to the low potential side power supply VSS via the transistors Q5, Q3 and Q1, and a through current also flows from the high potential side power supply VDD to the low potential side power supply VSS via the transistors Q6, Q4 and Q2, thereby increasing the power consumption during the reset phase.

Moreover, with the conventional current comparison type latch configuration, the output potential of each of the two output terminals OUT and OUTB being in a reset state is at the predetermined intermediate potential, as described above, and is not at a logic level (the "H" level or the "L" level). Therefore, in order to convert the output data of the current comparison type latch into one-clock-cycle data, a further stage of latch is required, thereby hindering a high-speed operation.

SUMMARY OF THE INVENTION

An object of the present invention is to provide a current comparison type latch which eliminates the through current flowing in a reset state so as to achieve a reduction in the power consumption, and which is capable of making a high-speed and high-precision comparison.

In order to achieve the above-described object, the present invention provides a current comparison type latch in which the output potential of an output terminal in a reset state can be fixed to a logic level (the "H" level or the "L" level).

Specifically, a current comparison type latch of the present invention includes: a first input terminal and a second input terminal to which two current signals to be compared with each other are input, respectively; a third input terminal to which a clock signal for switching between a reset operation and a latch operation is input; a first output terminal and a second output terminal for outputting signals resulting from a comparison between the two signals input to the first and second input terminals; an n-type first transistor and an n-type second transistor whose gates receive a predetermined voltage and whose drains are connected to the first and second input terminals, respectively; an n-type third transistor and an n-type fourth transistor whose sources are connected to the drains of the first and second transistors, respectively; an n-type fifth transistor and an n-type sixth transistor whose sources are connected to drains of the third and fourth transistors, respectively; a p-type seventh transistor and a p-type eighth transistor whose drains are connected to drains of the fifth and sixth transistors, respectively; a p-type ninth transistor whose gate is connected to a gate of the third transistor and to the drain of the sixth transistor and whose drain is connected to the drain of the fifth transistor; a p-type tenth transistor whose gate is connected to a gate of the fourth transistor and to the drain of the fifth transistor and whose drain is connected to the drain of the sixth transistor; an n-type eleventh transistor whose gate is connected to the gate of the third transistor and whose drain is connected to the gate of the fourth transistor; an n-type twelfth transistor whose gate is connected to the gate of the fourth transistor and whose drain is connected to the gate of the third transistor; and an n-type thirteenth transistor whose drain is connected to sources of the eleventh and twelfth transistors, wherein: sources of the seventh, eighth, ninth and tenth transistors are connected to a high potential power supply line; sources of the first, second and thirteenth transistors are connected to a low potential power supply line; the third input terminal is connected to gates of the fifth, sixth, seventh, eighth and thirteenth transistors; and the first and second output terminals are connected to the drains of the seventh and eighth transistors.

In one embodiment, the current comparison type latch of the present invention further includes: a third output terminal and a fourth output terminal; a p-type fourteenth transistor whose gate is connected to the first output terminal; a p-type fifteenth transistor whose gate is connected to the second output terminal; an n-type sixteenth transistor whose drain is connected to a drain of the fourteenth transistor and whose gate is connected to a drain of the fifteenth transistor; and an n-type seventeenth transistor whose drain is connected to the drain of the fifteenth transistor and whose gate is connected to the drain of the fourteenth transistor, wherein: sources of the fourteenth and fifteenth transistors are connected to the high potential power supply line; sources of the sixteenth and seventeenth transistors are connected to the low potential power supply line; the third and fourth output terminals are connected to the drains of the fourteenth and fifteenth transistors; and the comparison result signals output from the first and second output terminals are converted into comparison result signals whose cycle is equal to one cycle of the clock signal so as to output the converted comparison result signals from the third and fourth output terminals, respectively.

In one embodiment, the current comparison type latch of the present invention further includes: a p-type eighteenth transistor whose drain and source are connected to the drain and the source of the fourteenth transistor and whose gate is connected to the drain of the fifteenth transistor; and a p-type nineteenth transistor whose drain and source are connected to the drain and the source of the fifteenth transistor and whose gate is connected to the drain of the fourteenth transistor.

In one embodiment, the current comparison type latch of the present invention further includes: a fourth input terminal and a fifth input terminal to which two voltage signals to be compared with each other are input, respectively; a current source; a p-type twentieth transistor whose drain is connected to the first input terminal and whose source is connected to the current source; and a p-type twenty-first transistor whose drain is connected to the second input terminal and whose source is connected to the current source, wherein: the fourth and fifth input terminals are connected to gates of the twentieth and twenty-first transistors, respectively; and the voltage signals input to the fourth and fifth input terminals are converted into current signals to be input to the first and second input terminals, respectively.

Alternatively, the polarities of the transistors described above may be changed so that each p-type transistor is replaced with an n-type transistor and each n-type transistor replaced with a p-type transistor. In such a case, the high potential power supply line is replaced with a low potential power supply line and the low potential power supply line is replaced with a high potential power supply line.

Thus, in the current comparison type latch of the present invention, the potential during a reset mode is fixed at a logic level (the "H" level or the "L" level), thereby eliminating the through current during a reset mode and thus achieving a reduction in the power consumption.

Moreover, by fixing the potential during a reset mode at a logic level (the "H" level or the "L" level), it is possible to latch and hold data without adding a further stage of a current comparison type latch of the same configuration, and to easily convert the data into data whose cycle is equal to one cycle of a clock signal. Therefore, it is possible to realize a high-speed and high-precision latch operation.

DETAILED DESCRIPTION OF THE INVENTION

Embodiments of the present invention will now be described with reference to the accompanying drawings.

First Embodiment

Figure 1:
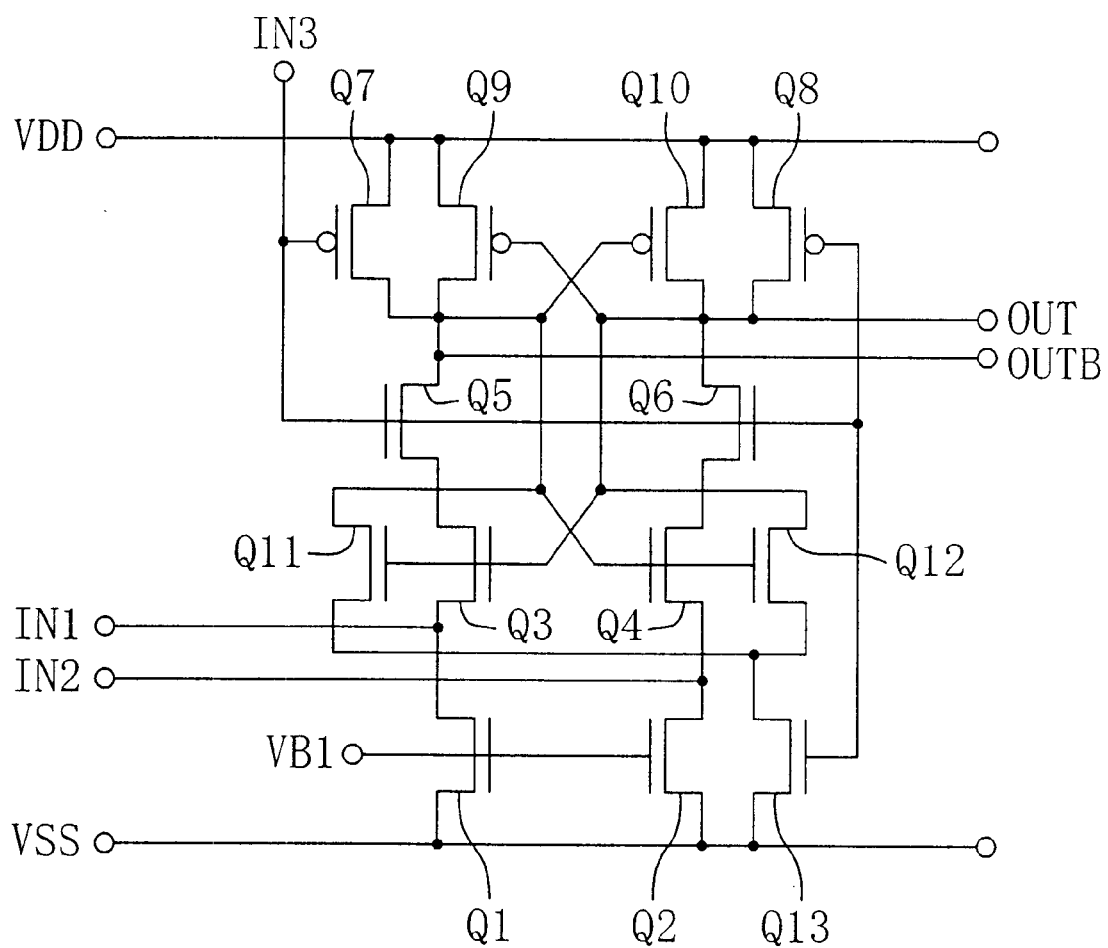
FIG. 1 is a circuit diagram illustrating a current comparison type latch according to the first embodiment of the present invention.

FIG. 1 illustrates an example of a current comparison type latch of the present invention.

The current comparison type latch illustrated in FIG. 1 includes a first input terminal IN1, a second input terminal IN2, a third input terminal IN3, a first output terminal OUT, a second output terminal OUTB, and first to thirteenth transistors Q1 to Q13.

Two current signals to be compared with each other are input to the first input terminal IN1 and the second input terminal IN2, respectively. A clock signal as a strobe signal is input to the third input terminal IN3, and a reset operation and a latch operation of the current comparison type latch are switched from one to another based on whether the clock signal is at the "H" level or the "L" level. The first and second output terminals OUT and OUTB are a pair of terminals for outputting signals resulting from a comparison between the two current signals input to the first and second input terminals IN1 and IN2.

A predetermined voltage VB1 is applied to the gates of the n-type (first conductivity type) first and second transistors Q1 and Q2, and the first and second input terminals IN1 and IN2 are connected to the drains thereof, respectively. By the predetermined voltage VB1, the first and second transistors Q1 and Q2 are operated in the linear region. Therefore, when current signals to be compared with each other are input to the first and second input terminals IN1 and IN2, a voltage according to the current difference occurs at the drains of the first and second transistors Q1 and Q2.

The drains of the first and second transistors Q1 and Q2 are connected to the sources of the n-type third and fourth transistors Q3 and Q4, respectively. The drains of the third and fourth transistors Q3 and Q4 are connected to the sources of the n-type fifth and sixth transistors Q5 and Q6, respectively. The drains of the p-type (second conductivity type) seventh and eighth transistors Q7 and Q8 are connected respectively to the drains of the fifth and sixth transistors Q5 and Q6.

The gate of the p-type ninth transistor Q9 is connected to the gate of the n-type third transistor Q3 and to the drain of the n-type sixth transistor Q6, and the drain thereof is connected to the drain of the n-type fifth transistor Q5. Moreover, the gate of the p-type tenth transistor Q10 is connected to the gate of the n-type fourth transistor Q4 and to the drain of the n-type fifth transistor Q5, and the drain thereof is connected to the drain of the n-type sixth transistor Q6. The gate of the n-type eleventh transistor Q11 is connected to the gate of the n-type third transistor Q3, and the drain thereof is connected to the gate of the n-type fourth transistor Q4. The gate of the n-type twelfth transistor Q12 is connected to the gate of the n-type fourth transistor Q4, and the drain thereof is connected to the gate of the n-type third transistor Q3. The drain of the n-type thirteenth transistor Q13 is connected to the sources of the eleventh and twelfth transistors Q11 and Q12.

The high potential power supply line VDD is connected to the sources of the seventh, eighth, ninth and tenth transistors Q7, Q8, Q9 and Q10, and the low potential power supply line VSS is connected to the sources of the first, second and thirteenth transistor Q1, Q2 and Q13. The third input terminal IN3 is connected to the gates of the fifth, sixth, seventh, eighth and the thirteenth transistors Q5, Q6, Q7, Q8 and Q13, and the first and second output terminals OUT and OUTB are connected respectively to the drains of the seventh and eighth transistors Q7 and Q8.

In the present embodiment, the strobe signal (clock signal) for controlling the operation mode of the current comparison type latch is input to the third input terminal IN3. During a reset operation in which the strobe signal is at the "L" level, the transistors Q5, Q6 and Q13 are turned OFF, and the transistors Q7 and Q8 are turned ON, whereby the first and second output terminals OUT and OUTB of the current comparison type latch are at a potential equal to the power supply potential VDD.

On the other hand, during a latch mode in which the strobe signal is at the "H" level, the transistors Q5, Q6 and Q13 are turned ON, and the transistors Q7 and Q8 are turned OFF, whereby a current comparison operation and a latch operation are performed. Now, when the value of the current input to the first input terminal IN1 is greater than the value of the current input to the second input terminal IN2, the source potential of the transistor Q3 is higher than the source potential of the transistor Q4. Since the gates of the transistors Q3 and Q4 are both connected to the high potential power supply line VDD during the reset mode, the drain current of the transistor Q4 is higher than the drain current of the transistor Q3. As a result, the drain of the transistor Q6, i.e., the potential of the first output terminal OUT, is lower than the drain of the transistor Q5, i.e., the second output terminal OUTB. The potential difference is amplified by a positive feedback operation by the transistors Q3, Q4, Q9, Q10, Q11 and Q12, whereby the first output terminal OUT is equal to the "L" level and the second output terminal OUTB is equal to the "H" level. In a steady state after this latch operation is completed, the n-type transistors Q4 and Q12 are ON while the p-type transistor Q10 is OFF, whereby no through current flows via the transistors Q4 and Q12, which are ON. Moreover, in this steady state, the p-type transistor Q9 is ON while the two n-type transistors Q3 and Q11 are OFF, whereby no through current flows via the transistor Q9, which is ON.

Moreover, during a current comparison operation and a latch operation in a latch mode, when the value of the current input to the first input terminal IN1 is smaller than the value of the current input to the second input terminal IN2, conversely to the case described above, the source potential of the transistor Q4 is higher than the source potential of the transistor Q3, and the drain current of the transistor Q3 is larger than the drain current of the transistor Q4. As a result, the potential of the drain of the transistor Q5, i.e., the potential of the second output terminal OUTB, is lower than the potential of the drain of the transistor Q6, i.e., the potential of the first output terminal OUT. The potential difference is amplified by a positive feedback operation by the transistors Q3, Q4, Q9, Q10, Q11 and Q12, whereby the first output terminal OUT is equal to the "H" level and the second output terminal OUTB is equal to the "L" level. In a steady state after this latch operation is completed, the n-type transistors Q3 and Q11 are ON while the p-type transistor Q9 is OFF, whereby no through current flows via the transistors Q3 and Q11, which are ON. Moreover, in this steady state, the p-type transistor Q10 is ON while the two n-type transistors Q4 and Q12 are OFF, whereby no through current flows via the transistor Q10, which is ON.

As described above, according to the present embodiment, during a reset mode, the strobe signal (clock signal) which is input to the third input terminal IN3 is at the "L" level, and the two n-type transistors Q5 and Q6 are turned OFF, while the two p-type transistors Q7 and Q8 are turned ON, whereby the output potential of each of the two output terminals OUT and OUTB is fixed at a logic level (the "H" level). Since the two n-type transistors Q5 and Q6 are turned OFF, as described above, the current path extending from the power supply line VDD to the ground line VSS is blocked, thereby eliminating the through current flowing from the power supply line VDD to the ground line VSS. Therefore, it is possible to achieve a reduction in the power consumption. Moreover, in a latch mode in which a current comparison is performed, it is possible to perform a precise latch operation using the above-described positive feedback.

Figure 4:
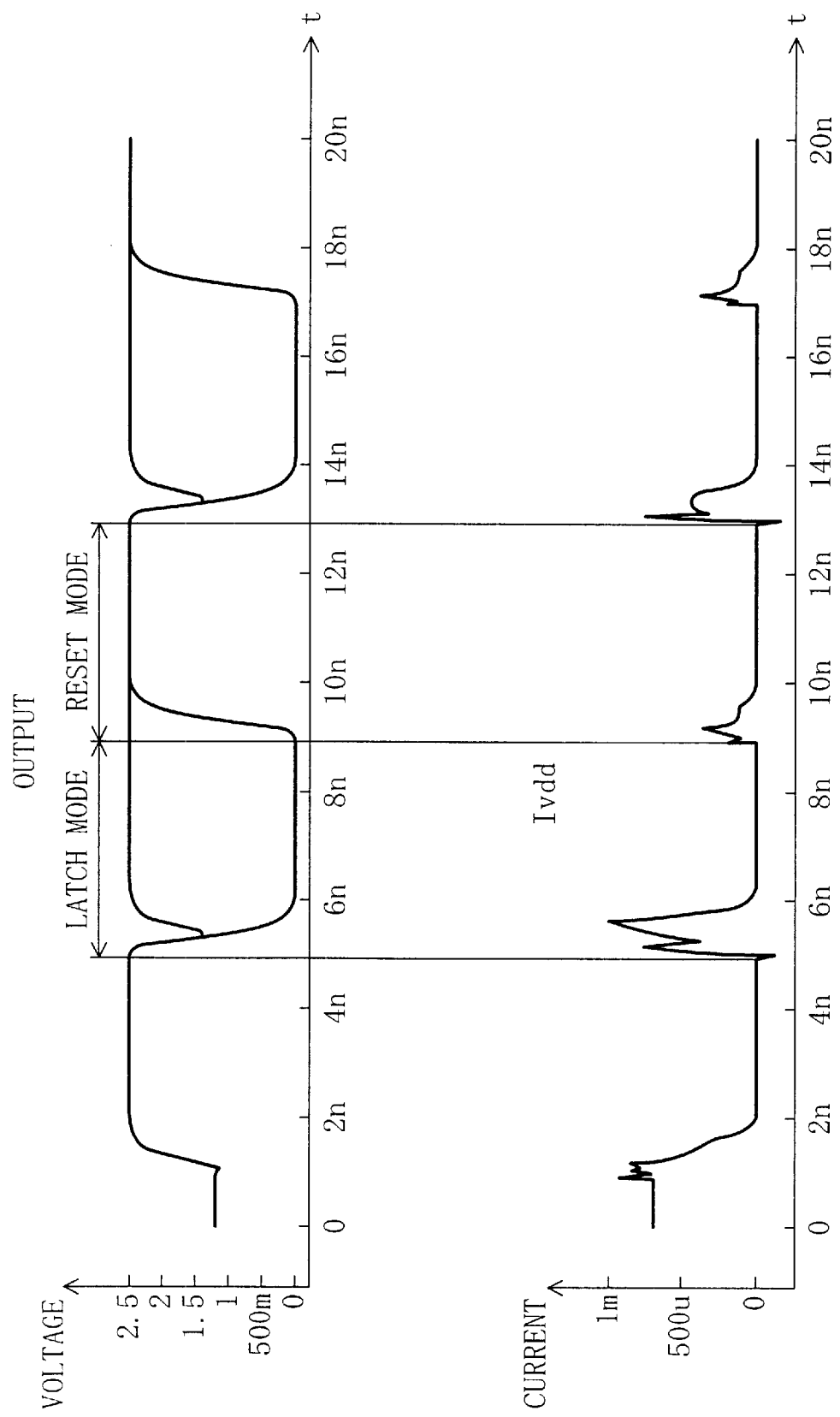
FIG. 4 is a characteristic diagram illustrating a simulation result of a current comparison type latch according to one embodiment of the present invention.
Figure 5:
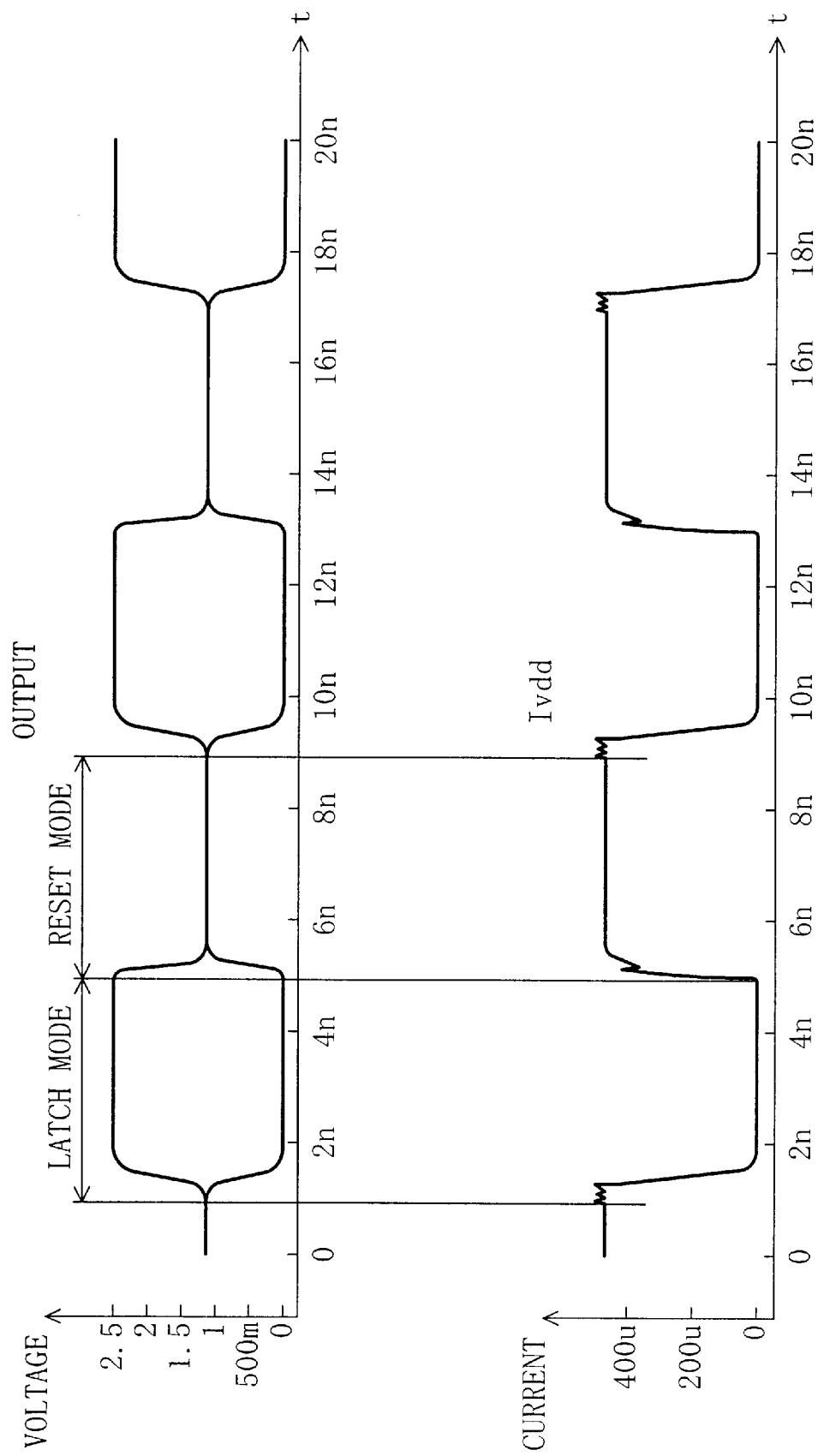
FIG. 5 is a characteristic diagram illustrating a simulation result of a conventional current comparison type latch.
Figure 9:
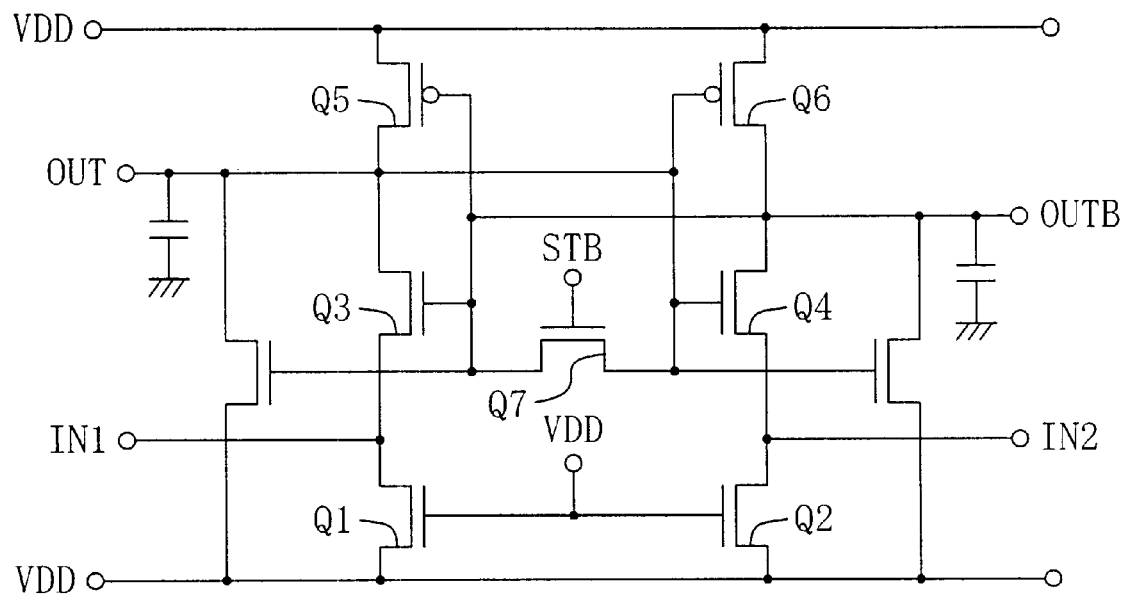
FIG. 9 is a circuit diagram illustrating a conventional current comparison type latch.

FIG. 4 and FIG. 5 illustrate simulation results for the present embodiment and the conventional example illustrated in FIG. 9, respectively. In these figures, the through current flowing from the power supply line VDD to the ground line VSS is denoted as "Ivdd". In the case of the conventional example illustrated in FIG. 5, during a reset mode, the output voltage of each of the output terminals OUT and OUTB is at a voltage level (1.2 v) which is substantially the mean value between the potential of the power supply line VDD (2.5 v) and potential of the ground line VSS (0 v). Thus, a large through current Ivdd is flowing. In contrast, it can be seen that in the case of the present embodiment illustrated in FIG. 4, since the output voltage of each of the output terminals OUT and OUTB during a reset mode is fixed to a logic level (the "H" level), no through current flows during a reset mode although the through current Ivdd transitionally flows in the beginning of a latch mode in which a data comparison is performed. Therefore, with the current comparison type latch of the present embodiment, it is possible to significantly reduce the power consumption.

Second Embodiment

Figure 2:
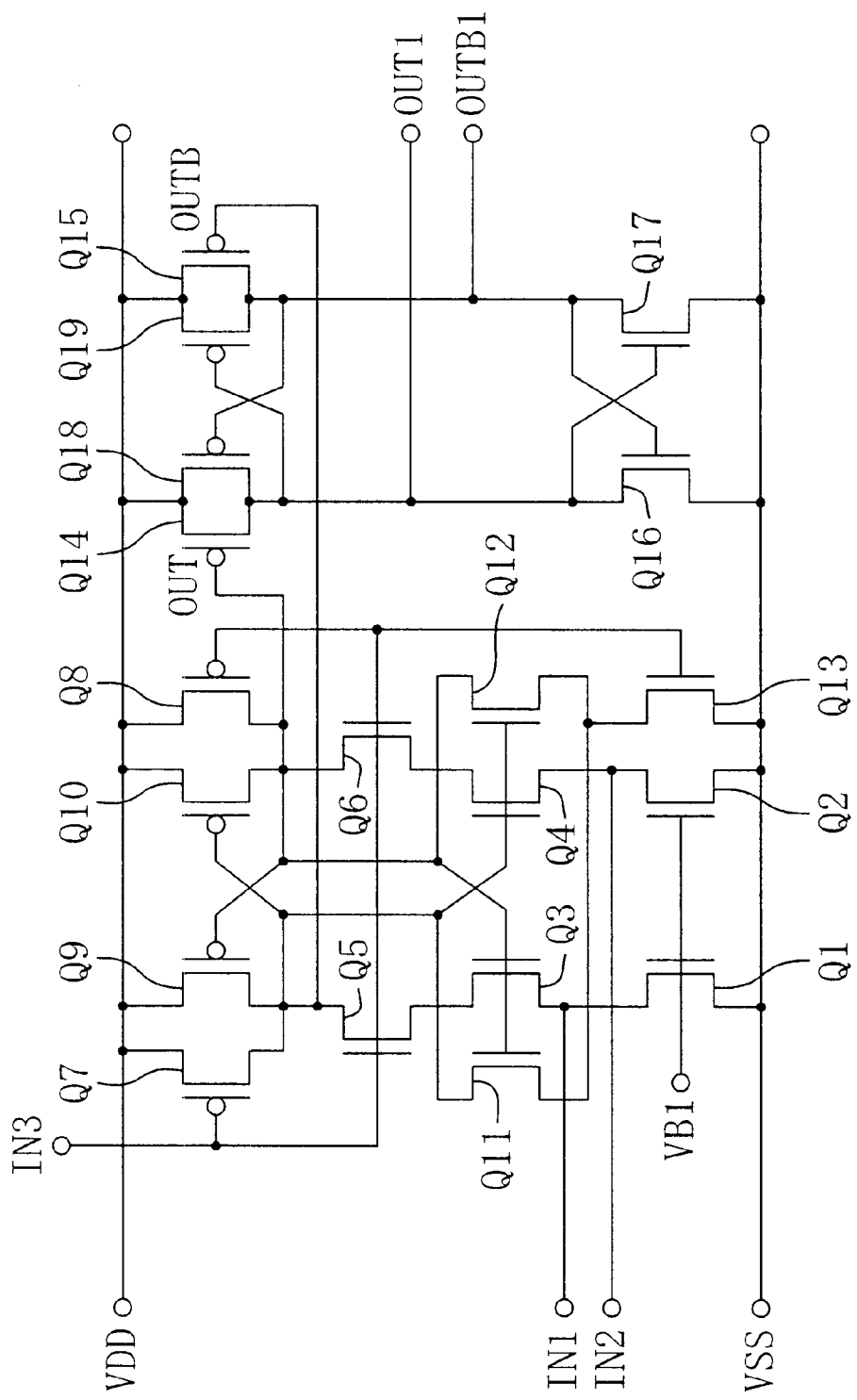
FIG. 2 is a circuit diagram illustrating a current comparison type latch according to the second embodiment of the present invention.

FIG. 2 illustrates a current comparison type latch of the present embodiment. The current comparison type latch of the present embodiment is obtained by further adding, to the configuration of FIG. 1, a third output terminal OUT1, a fourth output terminal OUTB1, and fourteenth to nineteenth transistors Q14 to Q19.

The gate of the p-type fourteenth transistor Q14 is connected to the first output terminal OUT, and the gate of the p-type fifteenth transistor Q15 is connected to the second output terminal OUTB. Moreover, the drain of the n-type sixteenth transistor Q16 is connected to the drain of the fourteenth transistor Q14, and the gate thereof is connected to the drain of the fifteenth transistor Q15. Furthermore, the drain of the n-type seventeenth transistor Q17 is connected to the drain of the fifteenth transistor Q15, and the gate thereof is connected to the drain of the fourteenth transistor Q14. The drain and the source of the p-type eighteenth transistor Q18 are connected respectively to the drain and the source the fourteenth transistor Q14, and the gate thereof is connected to the drain of the fifteenth transistor Q15. The drain and the source of the p-type nineteenth transistor Q19 are connected respectively to the drain and the source the fifteenth transistor Q15, and the gate thereof is connected to the drain of the fourteenth transistor Q14.

Furthermore, the high potential power supply line VDD is connected to the sources of the fourteenth and fifteenth transistors Q14 and Q15, and the low potential power supply line VSS is connected to the sources of the sixteenth and seventeenth transistors Q16 and Q17. Moreover, the third and fourth output terminals OUT1 and OUTB1 are connected to the drains of the fourteenth and fifteenth transistors Q14 and Q15, respectively.

Next, the operation of the current comparison type latch of FIG. 2 will be described. In a latch state where the strobe signal is at the "H" level, e.g., when the output of the first output terminal OUT is at the "L" level and the output of the second output terminal OUTB is at the "H" level, the transistors Q14, Q17 and Q18 are turned ON, and the transistors Q15, Q16 and Q19 are turned OFF, whereby the output of the third output terminal OUT1 is at the "H" level and the output of the fourth output terminal OUTB1 is at the "L" level. Conversely, when the output of the first output terminal OUT is at the "H" level and the output of the second output terminal OUTB is at the "L" level in a latch state, the transistors Q15, Q16 and Q19 are turned ON and the transistors Q14, Q17 and Q18 are turned OFF, whereby the output of the third output terminal OUT1 is at the "L" level and the output of the fourth output terminal OUTB1 is at the "H" level.

When the process enters a reset phase as the clock signal transitions to the "L" level, the outputs of the output terminals OUT and OUTB are both at the "H" level, whereby the transistors Q14 and Q15 are turned OFF, whereby the outputs of the third and fourth output terminals OUT1 and OUTB1 retain the previous levels due to the positive feedback operation of the transistors Q16, Q17, Q18 and Q19.

In this way, the signals representing a comparison result which are output from the output terminals OUT and OUTB are converted into digital signals representing a comparison result whose cycle is equal to one cycle of the clock signal input to the third input terminal IN3, and output from the third and fourth output terminals OUT1 and OUTB1.

Thus, as in the first embodiment, the current comparison type latch of the present embodiment is capable of latching and holding data while fixing the output potential of each of the output terminals OUT and OUTB at a logic level (the "H" level) during a reset mode, thereby eliminating the through current during a reset mode. Moreover, it is possible to convert data whose cycle is equal to ½ cycle of the clock signal into data whose cycle is equal to one cycle of the clock signal without adding a further stage of the current comparison type latch illustrated in FIG. 1.

In FIG. 2 illustrating the present embodiment, the positive feedback operation can be sufficiently realized with only the transistors Q16 and Q17. Therefore, functionally, the transistors Q18 and Q19 are not necessary. Nevertheless, with these transistors Q18 and Q19, it is possible to realize a more reliable positive feedback operation.

Third Embodiment

Figure 3:
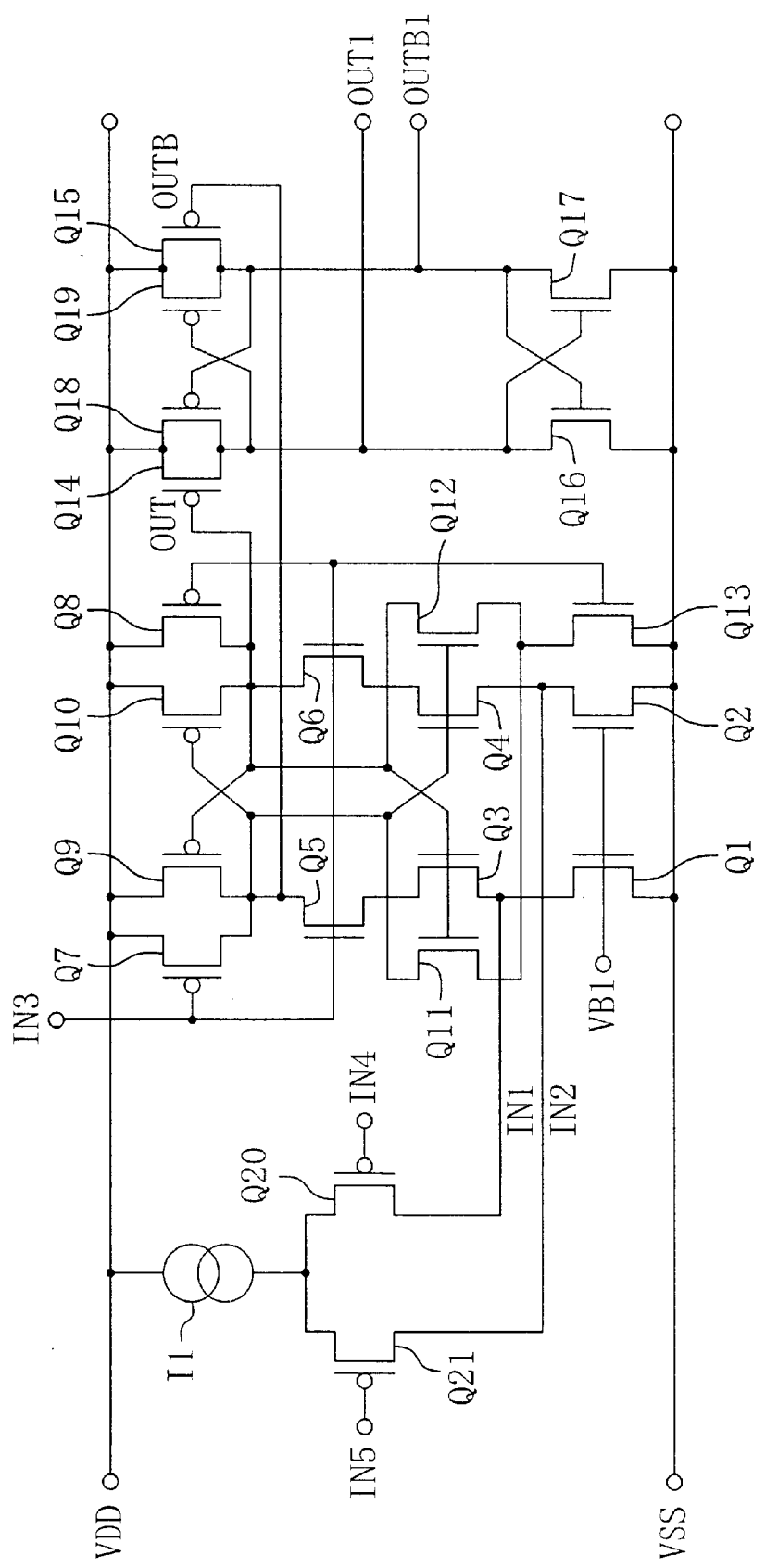
FIG. 3 is a circuit diagram illustrating a current comparison type latch according to the third embodiment of the present invention.

FIG. 3 illustrates a current comparison type latch of the present embodiment. The current comparison type latch of the present embodiment is similar to that of the second embodiment illustrated in FIG. 2 except that fourth and fifth input terminals IN4 and IN5, a current source I1, and p-type twentieth and twenty-first transistors Q20 and Q21 are added thereto.

Two voltage signals to be compared with each other are input to the fourth and fifth input terminals IN4 and IN5, respectively, and one end of the current source I1 is connected to the high potential voltage line VDD. The drain of the p-type twentieth transistor Q20 is connected to the first input terminal IN1, and the source thereof is connected to the current source I1. The drain of the p-type twenty-first transistor Q21 is connected to the second input terminal IN2, and the source thereof is connected to the current source I1. The fourth and fifth input terminals IN4 and IN5 are connected to the gates of the twentieth and twenty-first transistors Q20 and Q21, respectively.

Thus, in the present embodiment, the fourth and fifth input terminals IN4 and IN5 are connected to the gates of the twentieth and twenty-first transistors Q20 and Q21, respectively. Therefore, when two voltage signals to be compared with each other are input to the fourth and fifth input terminals IN4 and IN5, current signals proportional to the respective gate voltages of the transistors Q20 and Q21 (the two voltage signals to be compared with each other) flow through the transistors Q20 and Q21, and the currents flowing through transistors Q20 and Q21 are compared with each other by the transistors Q1 to Q13 as in the first embodiment described above.

As described above, with the current comparison type latch of the present embodiment, voltage signals input to the fourth and fifth input terminals IN4 and IN5 can be easily converted into current signals to be input to the first and second input terminals IN1 and IN2. Thus, a current comparison type latch can be easily converted into a voltage comparison type latch.

Moreover, with the current comparison type latch of the present embodiment, the voltage-current conversion operation, and the current comparison and latch operation are performed separately, thereby providing an advantage that so-called "kickback noise", i.e., changes in the potentials of the output terminals OUT and OUTB caused by a latch operation influencing the potentials of the input terminals IN1 and IN2, can be significantly reduced.

Figure 6:
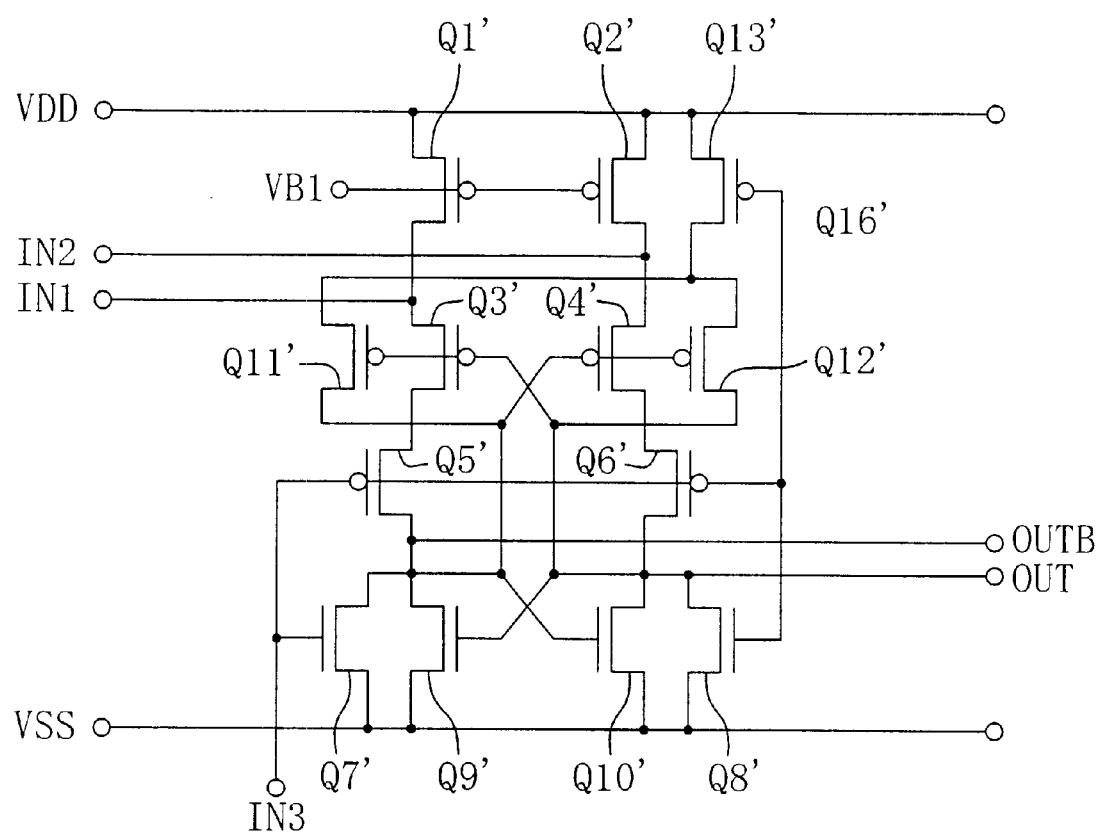
FIG. 6 is a circuit diagram illustrating a current comparison type latch similar to the current comparison type latch illustrated in FIG. 1 except that the polarities of the transistors are changed.
Figure 7:
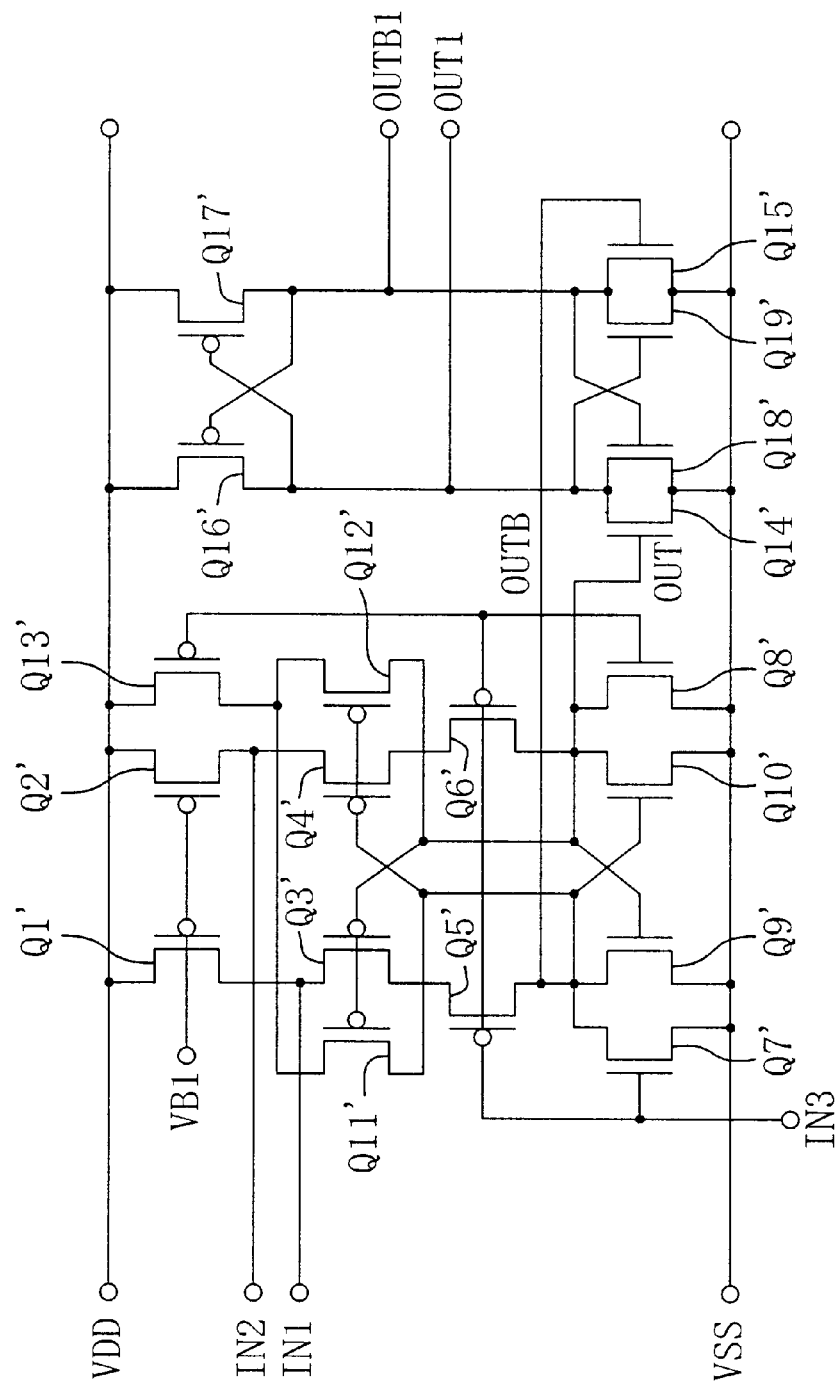
FIG. 7 is a circuit diagram illustrating a current comparison type latch similar to the current comparison type latch illustrated in FIG. 2 except that the polarities of the transistors are changed.
Figure 8:
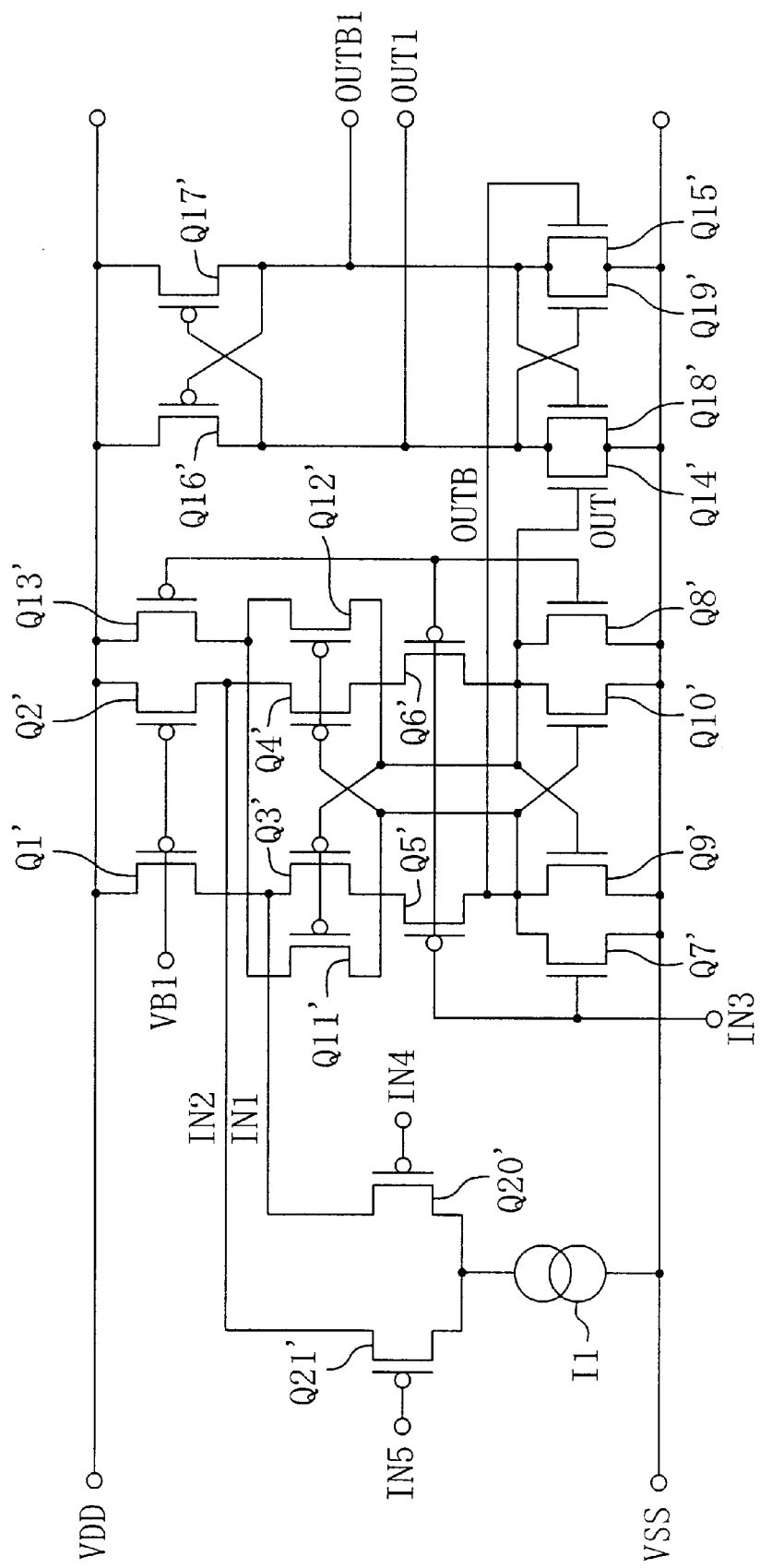
FIG. 8 is a circuit diagram illustrating a current comparison type latch similar to the current comparison type latch illustrated in FIG. 3 except that the polarities of the transistors are changed.

In the above description, it is assumed that the first polarity is n-type and the second polarity is p-type. However, the present invention is not limited to this, and the polarities can of course be reversed so that the first polarity is p-type and the second polarity is n-type. Each of FIG. 6 to FIG. 8 illustrates a configuration of a current comparison type latch in such a case. FIG. 6 corresponds to FIG. 1 illustrating the first embodiment, FIG. 7 corresponds to FIG. 2, and FIG. 8 corresponds to FIG. 3. In the configurations of FIG. 6 to FIG. 8, since the polarities are reversed from those in the configurations of FIG. 1 to FIG. 3, the high potential power supply line VDD and the low potential power supply line VSS are also reversed. Other than this, the configurations are the same as those illustrated in FIG. 1 to FIG. 3. Accordingly, each element already shown in FIG. 1 to FIG. 3 is denoted by the same reference numeral, and each transistor whose polarity is reversed is denoted by the same reference numeral as the corresponding transistor in FIG. 1 to FIG. 3 with an apostrophe attached thereto. The configurations of the current comparison type latches of FIG. 6 to FIG. 8 will not be further described herein.

What is claimed is:

1. A current comparison type latch, comprising:
   a first input terminal and a second input terminal to which two current signals to be compared with each other are input, respectively;
   a third input terminal to which a clock signal for switching between a reset operation and a latch operation is input;
   a first output terminal and a second output terminal for outputting signals resulting from a comparison between the two signals input to the first and second input terminals;

an n-type first transistor and an n-type second transistor whose gates receive a predetermined voltage and whose drains are connected to the first and second input terminals, respectively;

an n-type third transistor and an n-type fourth transistor whose sources are connected to the drains of the first and second transistors, respectively;

an n-type fifth transistor and an n-type sixth transistor whose sources are connected to drains of the third and fourth transistors, respectively;

a p-type seventh transistor and a p-type eighth transistor whose drains are connected to drains of the fifth and sixth transistors, respectively;

a p-type ninth transistor whose gate is connected to a gate of the third transistor and to the drain of the sixth transistor and whose drain is connected to the drain of the fifth transistor;

a p-type tenth transistor whose gate is connected to a gate of the fourth transistor and to the drain of the fifth transistor and whose drain is connected to the drain of the sixth transistor;

an n-type eleventh transistor whose gate is connected to the gate of the third transistor and whose drain is connected to the gate of the fourth transistor;

an n-type twelfth transistor whose gate is connected to the gate of the fourth transistor and whose drain is connected to the gate of the third transistor; and an n-type thirteenth transistor whose drain is connected to sources of the eleventh and twelfth transistors, wherein:

sources of the seventh, eighth, ninth and tenth transistors are connected to a high potential power supply line;

sources of the first, second and thirteenth transistors are connected to a low potential power supply line;

the third input terminal is connected to gates of the fifth, sixth, seventh, eighth and thirteenth transistors; and the first and second output terminals are connected to the drains of the seventh and eighth transistors.

2. The current comparison type latch of claim 1, further comprising:

a third output terminal and a fourth output terminal;

a p-type fourteenth transistor whose gate is connected to the first output terminal;

a p-type fifteenth transistor whose gate is connected to the second output terminal;

an n-type sixteenth transistor whose drain is connected to a drain of the fourteenth transistor and whose gate is connected to a drain of the fifteenth transistor; and an n-type seventeenth transistor whose drain is connected to the drain of the fifteenth transistor and whose gate is connected to the drain of the fourteenth transistor , wherein:

sources of the fourteenth and fifteenth transistors are connected to the high potential power supply line;

sources of the sixteenth and seventeenth transistors are connected to the low potential power supply line;

the third and fourth output terminals are connected to the drains of the fourteenth and fifteenth transistors; and the comparison result signals output from the first and second output terminals are converted into comparison result signals whose cycle is equal to one cycle of the clock signal so as to output the converted comparison result signals from the third and fourth output terminals, respectively.

3. The current comparison type latch of claim 2, further comprising:

a p-type eighteenth transistor whose drain and source are connected to the drain and the source of the fourteenth transistor and whose gate is connected to the drain of the fifteenth transistor; and a p-type nineteenth transistor whose drain and source are connected to the drain and the source of the fifteenth transistor and whose gate is connected to the drain of the fourteenth transistor.

4. The current comparison type latch of claim 1, further comprising:

a fourth input terminal and a fifth input terminal to which two voltage signals to be compared with each other are input, respectively;

a current source;

a p-type twentieth transistor whose drain is connected to the first input terminal and whose source is connected to the current source; and a p-type twenty-first transistor whose drain is connected to the second input terminal and whose source is connected to the current source, wherein:

the fourth and fifth input terminals are connected to gates of the twentieth and twenty-first transistors, respectively; and the voltage signals input to the fourth and fifth input terminals are converted into current signals to be input to the first and second input terminals, respectively.

5. A current comparison type latch, comprising:

a first input terminal and a second input terminal to which two current signals to be compared with each other are input, respectively;

a third input terminal to which a clock signal for switching between a reset operation and a latch operation is input;

a first output terminal and a second output terminal for outputting signals resulting from a comparison between the two signals input to the first and second input terminals;

a p-type first transistor and a p-type second transistor whose gates receive a predetermined voltage and whose drains are connected to the first and second input terminals, respectively;

a p-type third transistor and a p-type fourth transistor whose sources are connected to the drains of the first and second transistors, respectively;

a p-type fifth transistor and a p-type sixth transistor whose sources are connected to drains of the third and fourth transistors, respectively;

an n-type seventh transistor and an n-type eighth transistor whose drains are connected to drains of the fifth and sixth transistors, respectively;

an n-type ninth transistor whose gate is connected to a gate of the third transistor and to the drain of the sixth transistor and whose drain is connected to the drain of the fifth transistor;

an n-type tenth transistor whose gate is connected to a gate of the fourth transistor and to the drain of the fifth transistor and whose drain is connected to the drain of the sixth transistor;

a p-type eleventh transistor whose gate is connected to the gate of the third transistor and whose drain is connected to the gate of the fourth transistor;

a p-type twelfth transistor whose gate is connected to the gate of the fourth transistor and whose drain is connected to the gate of the third transistor; and a p-type thirteenth transistor whose drain is connected to sources of the eleventh and twelfth transistors, wherein:

sources of the seventh, eighth, ninth and tenth transistors are connected to a low potential power supply line;

sources of the first, second and thirteenth transistors are connected to a high potential power supply line;

the third input terminal is connected to gates of the fifth, sixth, seventh, eighth and thirteenth transistors; and the first and second output terminals are connected to the drains of the seventh and eighth transistors.

6. The current comparison type latch of claim 5, further comprising:

a third output terminal and a fourth output terminal;

an n-type fourteenth transistor whose gate is connected to the first output terminal;

an n-type fifteenth transistor whose gate is connected to the second output terminal;

a p-type sixteenth transistor whose drain is connected to a drain of the fourteenth transistor and whose gate is connected to a drain of the fifteenth transistor; and a p-type seventeenth transistor whose drain is connected to the drain of the fifteenth transistor and whose gate is connected to the drain of the fourteenth transistor, wherein:

sources of the fourteenth and fifteenth transistors are connected to the low potential power supply line;

sources of the sixteenth and seventeenth transistors are connected to the high potential power supply line;

the third and fourth output terminals are connected to the drains of the fourteenth and fifteenth transistors; and the comparison result signals output from the first and second output terminals are converted into comparison result signals whose cycle is equal to one cycle of the clock signal so as to output the converted comparison result signals from the third and fourth output terminals, respectively.

7. The current comparison type latch of claim 6, further comprising:

an n-type eighteenth transistor whose drain and source are connected to the drain and the source of the fourteenth transistor and whose gate is connected to the drain of the fifteenth transistor; and an n-type nineteenth transistor whose drain and source are connected to the drain and the source of the fifteenth transistor and whose gate is connected to the drain of the fourteenth transistor.

8. The current comparison type latch of claim 5, further comprising:

a fourth input terminal and a fifth input terminal to which two voltage signals to be compared with each other are input, respectively;

a current source;

an n-type twentieth transistor whose drain is connected to the first input terminal and whose source is connected to the current source; and an n-type twenty-first transistor whose drain is connected to the second input terminal and whose source is connected to the current source, wherein:

the fourth and fifth input terminals are connected to gates of the twentieth and twenty-first transistors, respectively; and the voltage signals input to the fourth and fifth input terminals are converted into current signals to be input to the first and second input terminals, respectively.

* * * * *